United States Patent [19]
Difrancesco

[11] Patent Number: 6,096,982
[45] Date of Patent: Aug. 1, 2000

[54] METHOD AND APPARATUS FOR CONDUCTIVELY JOINING COMPONENTS

[75] Inventor: Louis Difrancesco, Hayward, Calif.

[73] Assignee: Nanopierce Technologies, Inc., Denver, Colo.

[21] Appl. No.: 09/025,186

[22] Filed: Feb. 18, 1998

(Under 37 CFR 1.47)

[51] Int. Cl.[7] ........................................................ H05K 1/00
[52] U.S. Cl. .......................... 174/268; 361/749; 428/164
[58] Field of Search .................................... 174/251, 256, 174/257, 268, 117 F, 117 FF, 117 A; 361/749; 428/164

[56] References Cited

U.S. PATENT DOCUMENTS

| | | | |
|---|---|---|---|
| 4,460,804 | 7/1984 | Svejkovsky | 174/117 A |
| 4,548,862 | 10/1985 | Hartman | 428/323 |
| 5,494,730 | 2/1996 | Calhoun et al. | 428/164 |
| 5,670,251 | 9/1997 | DiFrancesco | 428/325 |

*Primary Examiner*—Kristine Kincaid
*Assistant Examiner*—Dhiru R Patel
*Attorney, Agent, or Firm*—Dorsey & Whitney LLP

[57] ABSTRACT

A flexible conductive tape is coated on at least one surface with an electrically conductive adhesive. The adhesive includes conductive particles dispersed therein. The adhesive-coated surface of a first segment of the flexible tape is joined to a substrate. The flexible tape is folded back at a crease, to expose a portion of the adhesive surface. At least one module is affixed to the exposed adhesive surface of the adjacent tape segment to form a sub-assembly. The sub-assembly is adapted for interengagement with a complementary modular assembly including electrical components and connectors. An electrical current is provided to the flexible tape.

16 Claims, 3 Drawing Sheets

METHOD AND APPARATUS FOR CONDUCTIVELY JOINING COMPONENTS

BACKGROUND OF THE INVENTION

1. Field of Invention

The invention relates generally to a connector structure for electrically joining two or more components. More particularly, the invention relates to the joining of components with a flexible conductor to provide electrical communication to and between said components.

2. Description of the Prior Art

It is well known that electrical components are electrically connected to a current source and to each other by insulated wires. The insulated wires must be individually run from one connection point to another. For example, in an automotive vehicle, one end of the wire may be connected to a current source, such as a battery. The other end of the wire is connected to a screw lug that is joined to a control module. Another wire is run from the control module to the specific component. This process is repeated for the various electrical components of the vehicle.

The use of insulated wires is very time consuming and is subject to errors from inaccurate assembly. To replace an electrical component or module, the insulated wires must be manually disconnected and reconnected to the replacement element. Furthermore, the width of insulated wire precludes its use in restricted spaces.

Insulated wires are frequently used with a single-side flex circuit board having a predetermined electrically connective path. One disadvantage of this method is the increased cost of manufacturing the flex circuit board, due to material requirements, labor and training costs. It is extremely difficult to automate the fabrication, assembly, and connection of insulated wires and flex circuit boards according to the prior art. Additionally, flex circuit board is not appropriate for use in small or irregularly-shaped spaces.

A flexible tape including electrically conductive strips in contact with a pressure sensitive adhesive layer containing electrically conductive particles is shown in U.S. Pat. No. 4,548,862.

An adhesive interconnecting means including conductive particles is shown in U.S. Pat. No. 4,642,421.

An electrically conductive adhesive tape containing electrically conductive particles in a predetermined pattern in the adhesive layer is shown in U.S. Pat. No. 5,494,730.

A curable adhesive and interconnect particle joint is described and claimed in applicant's copending application Ser. No. 08/320,443, filed Oct. 7, 1994, for "Patternable Particle Filled Adhesive Matrix for Forming Patterned Structures Between Joined Surfaces," now U.S. Pat. No. 5,670,251.

OBJECTS OF THE INVENTION

It is the principal object of the present invention to provide a method and apparatus for quickly and easily joining electrical components. It is another object to provide a method and apparatus which allows easy separation and replacement of components. It is a further object to provide a method and apparatus that are adapted for use in restricted or irregularly-shaped areas.

SUMMARY OF THE INVENTION

The invention is embodied in an improved method and apparatus for providing electrical connection to, and between, electrical components. A flexible conductive tape is coated on one surface with an electrically conductive adhesive. In the preferred embodiment of the invention, the electrically conductive adhesive contains conductive particles in a plated nickel matrix. The adhesive surface of a first segment of the flexible tape is joined to a substrate, preferably a sheet of flexible, nonconductive plastic, and is thermally bonded thereto. The flexible tape is folded back at a crease to expose the adhesive surface of this adjacent tape segment. At least one module is affixed to the exposed adhesive surface to form a sub-assembly. A module may comprise another electrical component or an electrical connector. The subassembly is adapted for interengagement with a complementary modular assembly including electrical components and connectors. An electrical current provided to the flexible tape of the sub-assembly is communicated to the sub-assembly modules by the conductive adhesive, and thence communicated to the interengaged assembly.

DETAILED DESCRIPTION OF THE INVENTION

Figure 1:
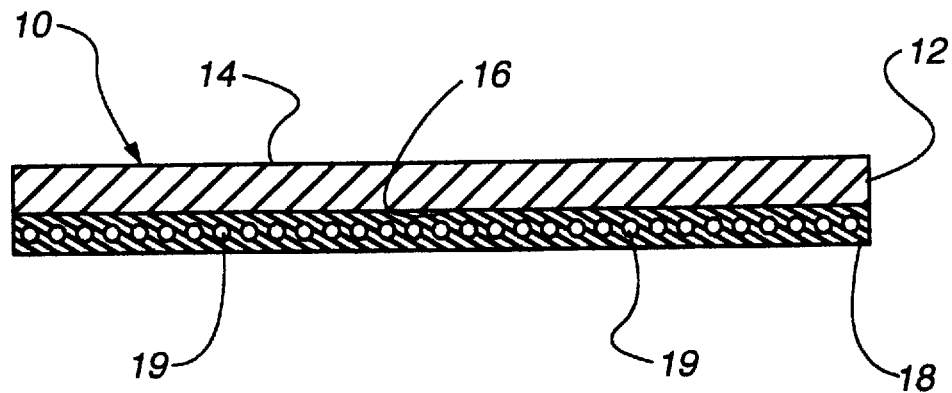
FIG. 1 is a cross-section view through a flexible, conductive, adhesive tape embodying the present invention.

The present invention is embodied in an electrically conductive tape 10 for providing electrical connection to and between electrical components. To this end, as shown in FIG. 1, a flexible tape 12 of conductive material defines a nonadhesive surface 14, and an opposite surface 16 coated with an electrically conductive adhesive coating 18 incorporating interconnect particles 19 dispersed therein. In a preferred embodiment of the invention, the flexible tape 12 is made of a conductive material such as copper or aluminum, or an appropriate conductive alloy. The dimensions of the tape are readily designed to suit the particular requirements of the user. In one preferred embodiment of the invention, the tape has a width of between approximately 5 mm and 5 cm. The conductive adhesive 18 incorporates hard particles 19 dispersed within an adhesive binder. An illustrative adhesive and interconnect particle composition is described in U.S. Ser. No. 08/320,436, filed Oct. 7, 1994.

Figure 2:
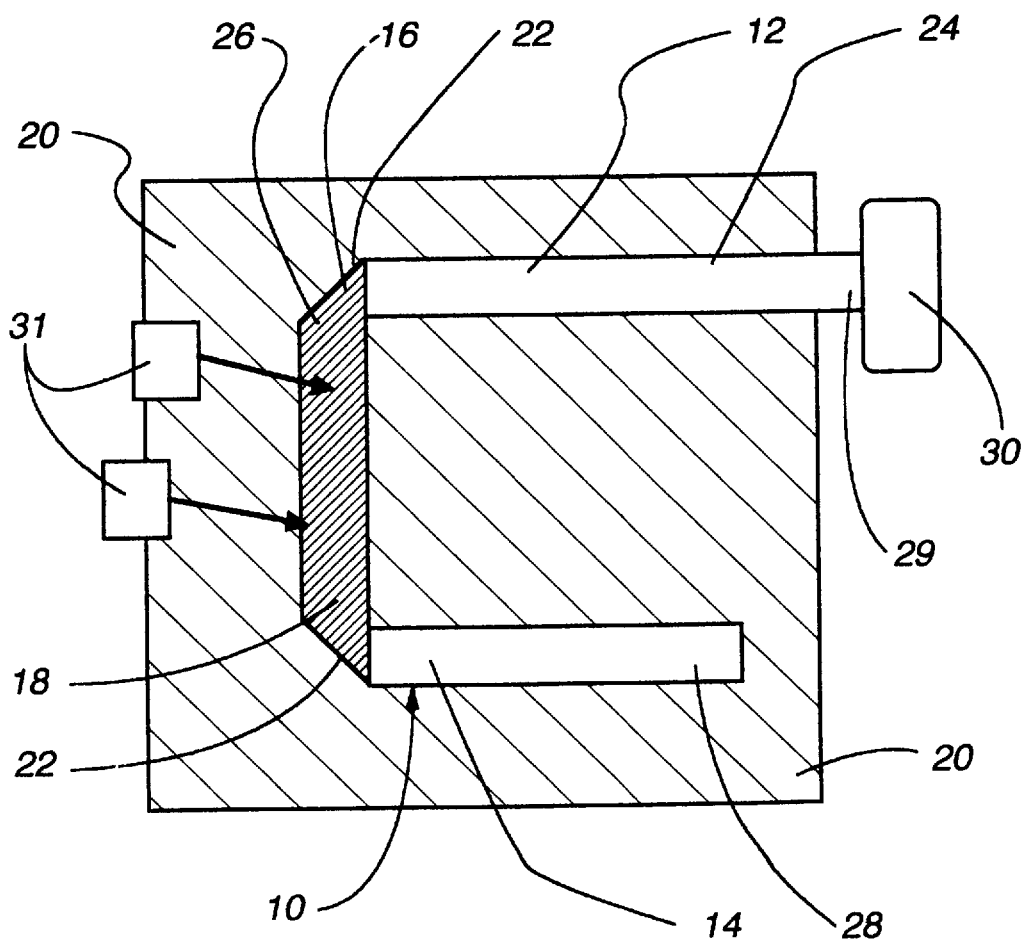
FIG. 2 is a top view of an electrical assembly utilizing a flexible, conductive, adhesive tape embodying the invention.

The adhesive coating 18 on the flexible tape 12 is sufficient to securely affix the tape to a non-conductive substrate 20 (FIG. 2). Alternatively, the adhesive surface is thermally or ultrasonically bonded to the substrate plastic. Further, an additional adhesive layer may be used to secure the flexible tape to the substrate 20. This additional adhesive layer may be added to either or both surfaces of the tape. The tape 10 is sufficiently flexible so as to be securely joined to planar, curved, beveled, or other non-planar surfaces. For example, the flexible tape may be joined to a molded panel for use in an automobile door or console. The thin width of tape, as contrasted with conventional wire, permits the tape and substrate to be used in confined spaces. Furthermore, as the tape is joined to the substrate along a substantial portion of its length, it is less subject to being accidentally snagged and disconnected than is a wire.

Before the flexible tape is affixed to a substrate 20, the tape is folded back at an angle to itself at a crease 22, as shown in FIG. 2, to divide the tape into a plurality of contiguous segments, three of which 24, 26, 28 are shown, two of which 24, 28 have an adhesive surface adhered to the non-conductive substrate and the third 26 defining an exposed adhesive segment facing away from the substrate. It is readily apparent that the tape may be folded to provide any number of required segments having alternating surfaces.

One end 29 of one segment 24 of the tape 12 may be conductively connected to a power supply such as a battery 30. At least one module 31 is affixed to the segment 26 defining an exposed adhesive surface to form a sub-assembly. A module 31 may include one of a variety of electrical components, such as solenoids, or door lock or mirror controls for a vehicle. A module 31 may also be an electrical connector or sensor.

After connection of the power supply 30 and modular units 31 to the tape 10, an insulating sheet or strip may be applied over the substrate 20 and conductive tape 12 to enclose and insulate the exposed conductive areas of the tape 12.

Figure 3:
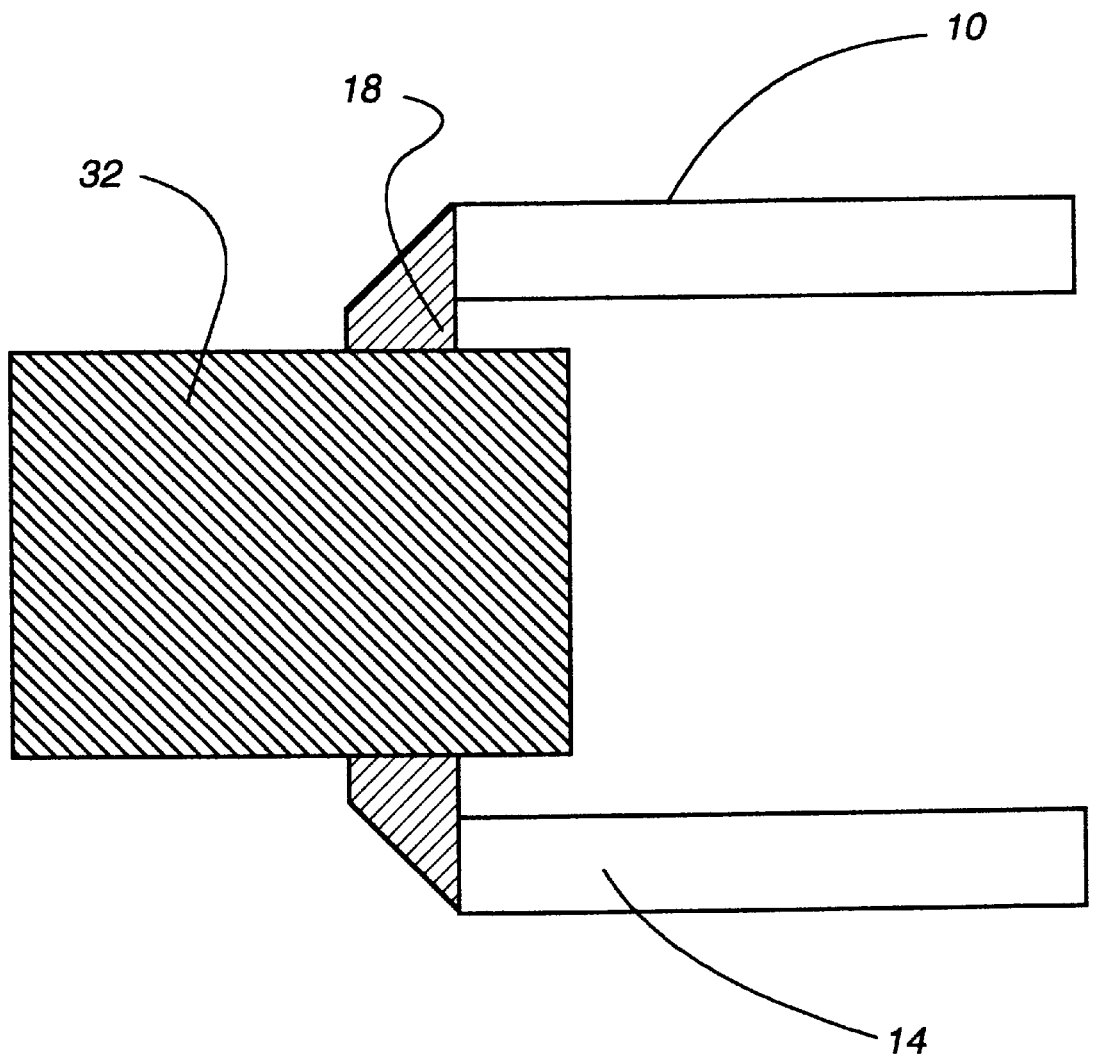
FIG. 3 is a top view of an electrical component and tape embodying the invention.

The tape 10 is also adapted for interengagement with a complementary modular assembly 32 including electrical components and/or connectors, as shown in FIG. 3. The assembly may be a separate, integral unit, or may be connected not only to the sub-assembly, but to some other member, such as an additional assembly. In the preferred embodiment of the invention, the substrate is a compliant plastic member that provides a compressive force to bias the sub-assembly against the modular assembly 32.

Figure 4:
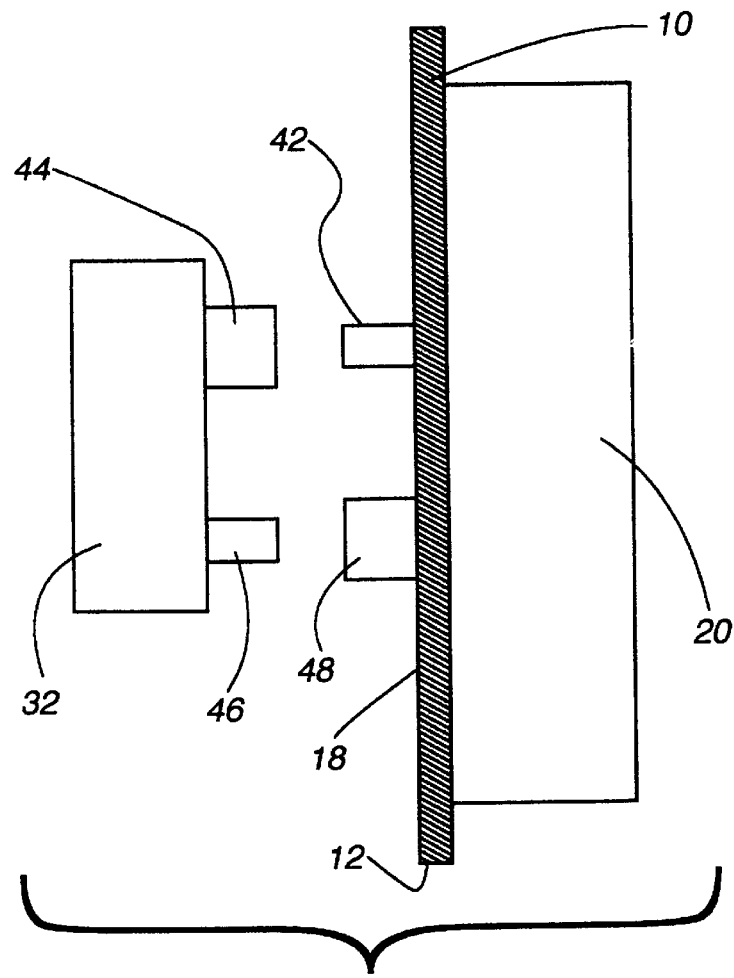
FIG. 4 is an enlarged side view of electrical modules formed by a tape embodying the invention.

A further embodiment of the invention, the module assembly 32 and subassembly are joined by complementary male 42 and female 44 modules, as shown in FIG. 4. Both electrical connector modules 46 and electrical component modules 48 may be provided as either male or female modules. In alternate embodiments of the invention, the modules of the assembly and sub-assembly are joined by other means, including adhesive and thermal bonding.

In another embodiment of the invention, the modules of the sub-assembly are provided in a male configuration, while those of the assembly are female. In still another embodiment, the modules of the sub-assembly are female, while those of the assembly are male. In yet another embodiment, the assembly and sub-assembly are each provided with both male and female interengaging modules.

Figure 5:
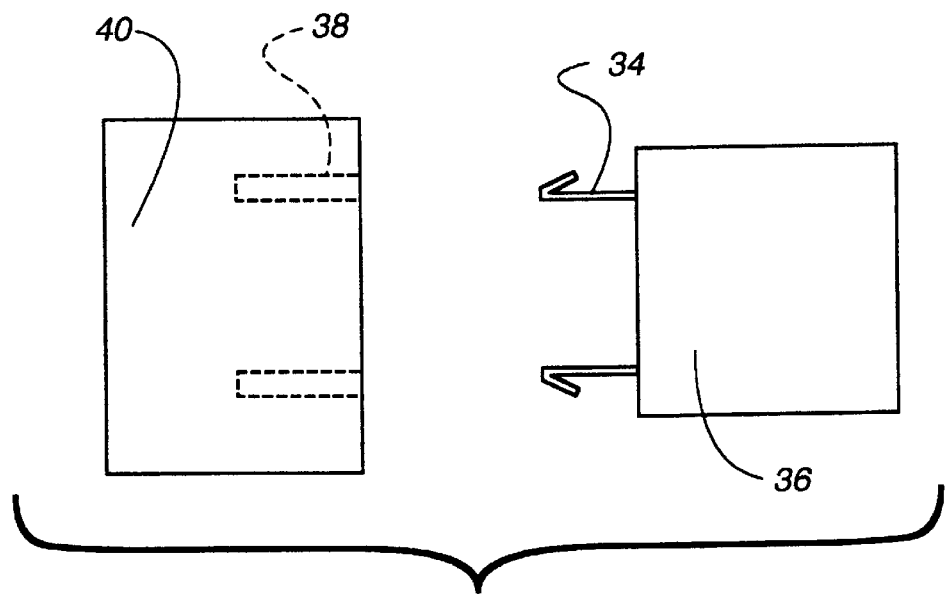
FIG. 5 is an enlarged side view of modules using mating pins and holes.

In a further embodiment of the invention, the modules 36, 40 are formed with mating alignment pins and holes, as shown in FIG. 5. At least one alignment pin 34 projects from a first module 36. The alignment pin is adapted for insertion into a complementary hole 38 defined in a second module 40. The alignment pin maintains the assembly and sub-assembly in a spaced orientation with one another. Additionally, the alignment pin provides a compressive force to secure the sub-assembly to the assembly. It is readily apparent that the alignment pin modules may be provided in varying configurations on the sub-assembly and assembly, as long as each module is provided with a complementary module.

An electrical current is subsequently provided to the flexible conductive tape of the sub-assembly. This current is communicated through the conductive adhesive to the sub-assembly modules, and thence communicated to the interengaged assembly.

Although the invention is described herein with reference to the preferred embodiment, one skilled in the art will readily appreciate that other applications may be substituted for those set forth herein without departing from the spirit and scope of the present invention. For example, the conductive adhesive according to the invention may permit the easy removal and replacement of defective or outmoded modules. The modules may be self-registering such that, for example, an alignment pin will only register one way in the appropriate hole of a complementary module. Additionally, the electrically-conductive adhesive may be applied to both surfaces of the flexible conductive tape, along the entirety or along selected portions of the tape. The sub-assembly may be joined to a substrate, such as a molded plastic article to provide an integrated electrical connection with the molding. A robot is preferably used to run the flexible-conductive tape from its original point of connection, for example, a battery, along the substrate. The robot then folds the tape at the appropriate locations for the attachment of modules. The tape may also be positioned by hand. An individual tape may be folded to form any required number of sub-assemblies, at the desired locations on the substrate.

A tape insulation covering permits one flexible conductive-adhesive tape to cross over another such tape without electrical connection. The method and apparatus of the invention are adaptable for uses including building wiring, and vehicle instrument or electrical panels, such as electric door lock, window or mirror controls. Sub-assemblies can be customized and produced for assembly-line use. For example, an individual sub-assembly can include modules for automatic windows, mirrors and door locks. Such a sub-assembly is readily snapped on to passing vehicles on an assembly line.

What is claimed is:

1. Electrical apparatus comprising
   an electronic module,
   a substrate for supporting said module,
   a flexible electrically conductive tape having opposed surfaces, and
   an electrically conductive adhesive coating on one of said surfaces,
   said tape being folded at an angle to itself along a crease line to provide a plurality of contiguous tape segments defining oppositely exposed adhesive surfaces,
   one of said segments being adhered to said substrate and another of said segments being adhered to said module.

2. Electrical apparatus as defined in claim 1, wherein said module is selected form the group consisting of electrical connectors, electrical components, solenoids, and sensors.

3. Electrical apparatus as defined in claim 1, wherein said substrate is formed of a material selected from the group consisting of Acrylonitrile-Butadiene-Styrene, polycarbonate, polyvinyl chloride, polyester, and polyacrylic.

4. Electrical apparatus as defined in claim 1, further comprising an insulating coating over said substrate, module and conductive tape.

5. Electrical apparatus as defined in claim 1, wherein said module comprises a plurality of modules formed by male and female interengaging connectors.

6. A method for providing electrical contact between components, comprising the steps of:
   depositing an electrically-conductive adhesive coating upon a first surface of a flexible, electrically-conductive tape having a second, nonadhesive surface;
   joining said surface of a first tape segment to a substrate;

folding said flexible tape at a crease to form an adjacent tape segment, wherein said non-adhesive surface of said adjacent tape segment is exposed to said substrate;

affixing at least one module to said adhesive surface of said adjacent tape segment to form a sub-assembly adapted for interengagement with a complementary assembly; and providing an electrical current through said flexible tape, wherein said electrical current is available to said sub-assembly and assembly.

7. The method of claim 6, wherein said flexible tape is formed of copper.

8. The method of claim 6, wherein said adhesive-coated surface of said first tape segment is thermally bonded to said substrate.

9. The method of claim 6, wherein said electrically-conductive adhesive comprises hard particles dispersed within an adhesive binder.

10. The method of claim 9, wherein said hard particles are electrically conductive.

11. The method of claim 9, wherein said adhesive binder is electrically conductive.

12. The method of claim 6, further comprising the step of folding said flexible tape back at a plurality of creases, to provide a plurality of contiguous segments, wherein said adhesive and non-adhesive surfaces of said tape segments are alternately exposed to said substrate.

13. The method of claim 6, further comprising the step of biasing said substrate against said at least one module to provide a compressive force to support said sub-assembly.

14. The method of claim 6, further comprising the steps of:

covering at least a portion of said first flexible tape with an insulator; and running at least a second flexible tape over said insulator-covered portion of said first flexible tape;

wherein said first and second flexible tapes are insulated from electrical contact with one another.

15. A method for providing electrical contact between components, comprising the steps of:

depositing an electrically-conductive adhesive coating upon a first surface of a flexible, electrically-conductive tape having a second, nonadhesive surface;

joining said adhesive-coated surface of at least a first tape segment to a substrate;

folding said flexible tape along at least one crease to form a plurality of contiguous tape segments, wherein said adhesive and non-adhesive surfaces of adjacent tape segments are alternately exposed to said substrate;

affixing at least one module to said adhesive surface of said adjacent tape segment to form a sub-assembly adapted for interengagement with a complementary assembly;

biasing said substrate against said at least one module to provide a compressive force to support said sub-assembly; and providing an electrical current through said flexible tape, wherein said electrical current is available to said sub-assembly and assembly.

16. The method of claim 15, further comprising the steps of:

covering at least a portion of a first flexible tape with an insulator; and running at least a second flexible tape over said insulator-covered portion of said first flexible tape;

wherein said first and second flexible conductive tapes are insulated from electrical contact with one another.

* * * * *